United States Patent [19]

McEachern et al.

[11] Patent Number: 5,298,888
[45] Date of Patent: Mar. 29, 1994

[54] HARMONIC MEASURING INSTRUMENT FOR AC POWER SYSTEMS WITH LATCHED INDICATOR MEANS

[75] Inventors: Alexander McEachern, Oakland; Jamie Nicholson, Foster City, both of Calif.

[73] Assignee: Basic Measuring Instruments, Foster City, Calif.

[21] Appl. No.: 934,116

[22] Filed: Aug. 21, 1992

[51] Int. Cl.⁵ ............................................. G08B 21/00
[52] U.S. Cl. .................................. 340/660; 340/662; 340/664; 364/483; 324/107
[58] Field of Search .................... 340/557, 663, 664; 324/76.12, 76.24, 76.42, 141, 142, 107, 133, 542, 543, 539; 364/483, 484; 361/78, 113

[56] References Cited

U.S. PATENT DOCUMENTS

| | | | |
|---|---|---|---|
| 4,641,090 | 2/1987 | Danby | 324/107 |
| 4,868,704 | 9/1989 | Cavero | 364/483 X |
| 4,884,021 | 11/1989 | Hammond et al. | 324/142 |
| 4,924,412 | 5/1990 | Leydier | 364/483 |
| 4,931,725 | 6/1990 | Hutt et al. | 324/142 |
| 4,933,869 | 6/1990 | Gareis et al. | 364/483 |
| 4,964,055 | 10/1990 | Grassel et al. | 364/485 |
| 4,977,513 | 12/1990 | LaPalme | 364/483 |
| 5,059,896 | 10/1991 | Germer et al. | 324/142 |
| 5,212,441 | 5/1993 | McEachern et al. | 324/142 |
| 5,224,054 | 6/1993 | Wallis | 364/483 |

OTHER PUBLICATIONS

"IEEE Recommended Practices and Requirements for Harmonic Control in Electric Power Systems", Project IEEE-519/D7, Draft for Balloting dated Dec., 1990.

Primary Examiner—John K. Peng
Assistant Examiner—Tim Johnson
Attorney, Agent, or Firm—Haverstock, Medlen & Carroll

[57] ABSTRACT

An instrument for measuring voltage harmonics and current harmonics on AC (alternating current) power systems. The instrument includes the ability to determine when threshold limits have been exceeded for harmonics. The instrument also includes timing thresholds whose inputs are activated when the harmonic thresholds are exceeded. A single harmonic threshold is applied to measurements from multiple phases on polyphase systems by comparing the square root of the sum of the squares of measurements from each phase to the harmonic threshold. Three indicators show when voltage harmonic limits are exceeded, current harmonics limits are exceeded, or both voltage and current harmonic limits are exceeded simultaneously.

20 Claims, 4 Drawing Sheets

HARMONIC MEASURING INSTRUMENT FOR AC POWER SYSTEMS WITH LATCHED INDICATOR MEANS

FIELD OF THE INVENTION

This invention relates to instruments that measure voltage and current waveforms on AC (alternating current) power lines. More specifically, this invention relates to instruments that measure harmonic voltages and harmonic currents on AC power lines and then compare those measurements to thresholds.

BACKGROUND OF THE INVENTION

Electric power is ordinarily delivered to residences, commercial facilities, and industrial facilities as AC (alternating current) voltage that approximates a sine wave with respect to time, and ordinarily flows through a residence or facility as an AC current that also approximates a sine wave with respect to time. The electric power distribution system operates most efficiently and most safely when both the voltage and current are sine waves. However, certain kinds of loads draw current in a non-sinusoidal waveform, and, if, these loads are large relative to the distribution system source impedance, the system voltage can become non-sinusoidal as well.

These non-sinusoidal voltage and current waveforms may be conveniently expressed as a Fourier series (a sum of sinusoidal waveforms of varying frequency, amplitude, and phase angle). Under most circumstances, the Fourier series for AC power system voltage and currents consists of a fundamental frequency, typically 50 Hertz or 60 Hertz, plus integer multiples of the fundamental frequency. These integer multiples of the fundamental frequency are referred to as "harmonics".

Instruments for measuring AC power system voltage and current harmonics are well known to those skilled in the art. One such commercially available instrument is the model 3030A PowerProfiler available from Basic Measuring Instruments, Foster City, Calif. Another commercially available instrument is the Model HP3588A Spectrum Analyzer available from the Hewlett Packard Corporation of Santa Clara, Calif. These instruments provide rapid, accurate assessment of the level of harmonic voltages and currents on an AC power system.

With the growing popularity of non-linear electric power loads such as adjustable speed drives, personal computers, and arc furnaces, it is often desirable to determine and record whether the level of voltage harmonics or current harmonics exceed some limit. As a general rule, the supplier of electricity is responsible for ensuring that the voltage harmonics are below some threshold, and the consumer of electricity is responsible for keeping harmonic currents below some other threshold. Harmonic thresholds are thus used to assign responsibility for eliminating voltage and current harmonics.

Table 1 below represents an example of a desired set of limits on voltage harmonics that apply to the provider of power. The Bus Voltage is measured at the point of common coupling (PCC) and the Total Harmonic Voltage Distortion (THD) is calculated as a percentage of the nominal fundamental frequency voltage.

TABLE 1

| | Voltage Distortion Limits | |
|---|---|---|
| Bus Voltage at PCC | Individual Harmonic Voltage Distortion (%) | Total Harmonic Voltage Distortion THD (%) |
| Below 69 kV | 3.0 | 5.0 |
| 69 kV to 138 kV | 1.5 | 2.5 |
| 138 kV and above | 1.0 | 1.5 |

Table 2 below represents an example of a desired set of limits on current harmonics that apply to the consumer of power. The Maximum Harmonic Current Distortion as a percentage of the maximum demand load current ($I_L$) at the fundamental frequency measured at the PCC is presented for odd harmonics in different ranges of the maximum short circuit current ($I_{SC}$) measured at the PCC divided by $I_L$. The column at the far right of the table represents the Total Demand Distortion (TDD) harmonic current distortion as a percentage of the maximum demand load current. The even harmonics are limited to 25% of the odd harmonic limits in the table.

TABLE 2

| | Current Distortion Limits Maximum Harmonic Current Distortion in % of $I_L$ Harmonic Order (Odd Harmonics) | | | | | |
|---|---|---|---|---|---|---|
| $I_{SC}/I_L$ | <11 | 11 ≦ h < 17 | 17 ≦ h < 23 | 23 ≦ h < 35 | 35 ≦ h | TDD |
| <20 | 4.0 | 2.0 | 1.5 | 0.6 | 0.3 | 5.0 |
| 20 < 50 | 7.0 | 3.5 | 2.5 | 1.0 | 0.5 | 8.0 |
| 50 < 100 | 10.0 | 4.5 | 4.0 | 1.5 | 0.7 | 12.0 |
| 100 < 1000 | 12.0 | 5.5 | 5.0 | 2.0 | 1.0 | 15.0 |
| >1000 | 15.0 | 7.0 | 6.0 | 2.5 | 1.4 | 20.0 |

Commercially available instruments such as the Basic Measuring Instruments model 3030A can be equipped with a feature that allows a user to program a threshold for a voltage harmonic, and program a second threshold for a current harmonic, then receive an alarm if these thresholds are exceeded. However, these independent thresholds fail to take into account the fact that increased harmonic currents may cause increased harmonic voltages. Consequently, independent voltage and current harmonic thresholds are not optimal for assigning responsibility for harmonic problems.

Commercially available power system harmonic instruments, such as the Basic Measuring Instruments model 3030A and the Model 8000 Power Analyzer available from Dranetz Technologies of Edison, N.J., apply each harmonic threshold independently to each phase on poly-phase systems. For example, if the user selects a 4% threshold on the fifth current harmonic, these instruments will sound an alarm if the fifth current harmonic on Phase A of a three phase system exceeds 4%, or if the fifth current harmonic on Phase B of a three phase system exceeds 4%, or if the fifth current harmonic on Phase C of a three phase system exceeds 4%. This method of applying harmonic thresholds fails to accurately assess the physical impact of the harmonic levels on polyphase distribution systems.

Commercially available instruments such as the BMI Model 3030A and the Dranetz Technologies Model 8000 offer the ability to chart harmonic levels over time. This approach is useful for analyzing a harmonic problem; however, it cannot provide a yes or no answer to the question: does this measurement location have a harmonics problem? Simpler instruments, such as the one disclosed by Grassel et al. in U.S. Pat. No. 4,964,055, offer the ability to take a snapshot of harmonic levels. Although this method can provide a yes or no answer to the question posed above for one instant in time, harmonic levels typically fluctuate widely with time of day, types of loads turned on, and other factors, so it cannot provide an answer over a period of time.

It is an object of this invention to provide a simple, direct indication of whether there is a harmonics problem at a measurement location that takes into account the variation in harmonic levels over time. It is a further object of this invention to apply harmonics thresholds to poly-phase power systems in a way that more accurately reflects the physical impact of harmonics on AC power distribution systems. It is a further object of this invention to apply harmonic thresholds to AC power systems in a way that acknowledges that increased harmonic currents can cause increased harmonic voltages.

SUMMARY OF THE INVENTION

An instrument for measuring voltage harmonics and current harmonics on AC (alternating current) power systems. The instrument includes the ability to determine when threshold limits have been exceeded for harmonics. The instrument also includes timing thresholds whose inputs are activated when the harmonic thresholds are exceeded. A single harmonic threshold is applied to measurements from multiple phases on polyphase systems by comparing the square root of the sum of the squares of measurements from each phase to the harmonic threshold. Three indicators show when voltage harmonic limits are exceeded, current harmonics limits are exceeded, or both voltage and current harmonic limits are exceeded simultaneously.

DETAILED DESCRIPTION OF A PREFERRED EMBODIMENT

Figure 1:
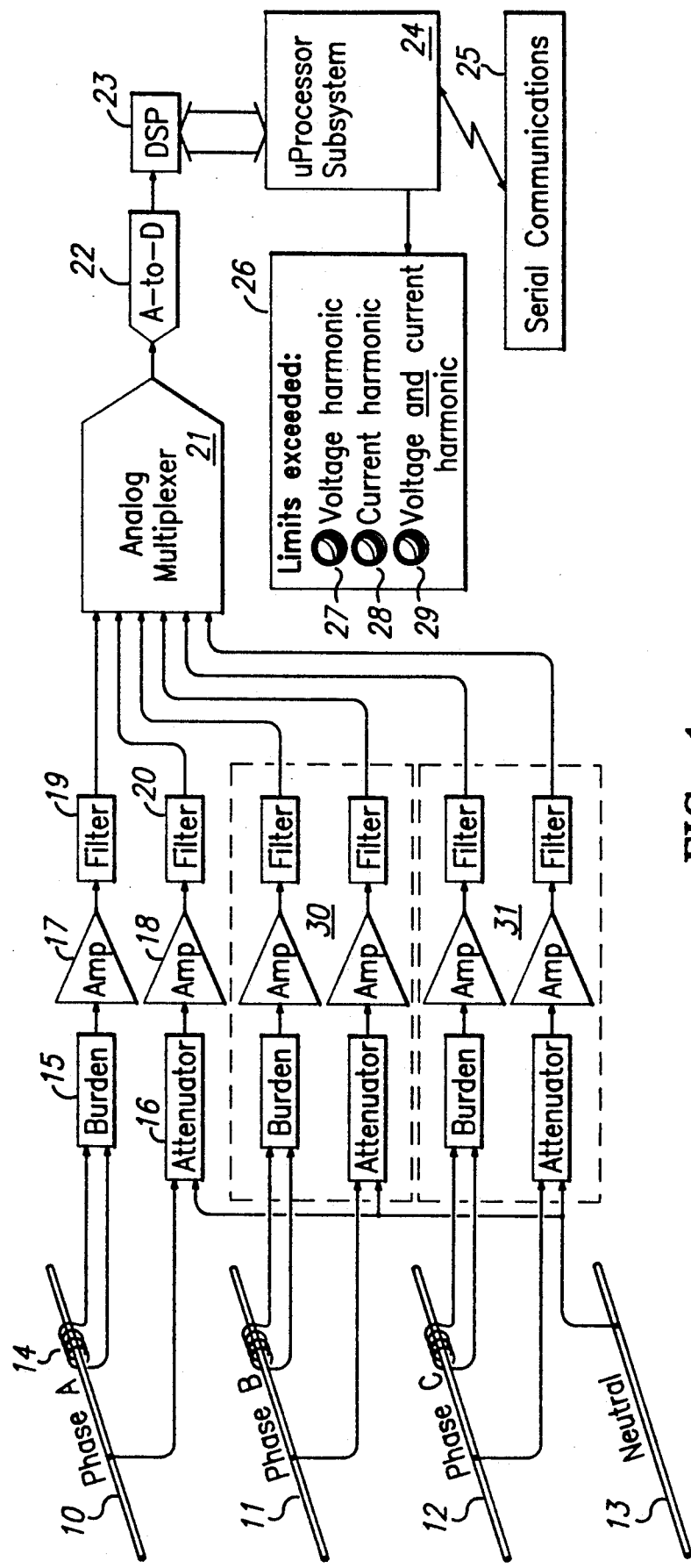
FIG. 1 shows a block diagram of the preferred embodiment of the invention.

FIG. 1 shows a block diagram of a preferred embodiment of the invention. Three-phase power flows on power system conductors 10,11,12,13 from a supplier, such as an electric utility company, to a consumer, such as a building. Coupled to the Phase A conductor 10 are a current transformer 14 and an associated burden resistor 15 which together produce a voltage at an appropriate level for further processing that is proportional to the current flowing in the Phase A conductor 10. The voltage attenuator 16 reduces the voltage difference observed between the Phase A conductor 10 and the Neutral conductor 13 to a level appropriate for further processing. The outputs of the burden resistor 15 and the attenuator 16 are coupled to the amplifiers 17, 18 which adjust the amplitudes of the respective signals. The output of each one of the amplifiers 17,18 is connected to one of the low-pass filters 19,20, respectively which remove undesired frequencies from the signals.

The functions performed for Phase A 10 by its associated circuits 15,16,17,18,19,20 are performed identically for Phase B by its associated circuits 30 and for Phase C by its associated circuits 31. The filtered voltage and current signals from each phase are delivered to a multiplexer 21, which presents each signal in turn to an A-to-D (Analog-to-Digital) converter 22. The A-to-D converter 22 uses well-known techniques to convert the analog voltage and current signals to regularly-sampled digital time-domain representations of the signals. These time-domain representations are passed to a DSP (Digital Signal Processor) 23, which converts them to frequency-domain representations which are in turn passed to a Microprocessor Subsystem 24. It will be apparent to a person of ordinary skill in the art that the time-domain signals can be passed directly from the Aa-to-D converter 22 to the Microprocessor Subsystem 24 without using a DSP 23. In such systems, the Microprocessor Subsystem 24 can be conditioned to perform the conversion of the signals to the frequency-domain.

Using techniques described further below, the Microprocessor Subsystem 24 applies thresholds to the harmonics observed in the frequency domain representations then determines whether any of the thresholds have been exceeded. If any thresholds have been exceeded, the Microprocessor Subsystem 24 communicates the event through the Serial Communications port 25 and illuminates the appropriate latched indicator in its display 26.

For a single-phase power system having a power line conductor and a power neutral conductor the same instrument can be used, but with Phase B and Phase C and their associated circuits disconnected or a simpler instrument which does not include the circuitry required for Phase B and Phase C can be used. The analog multiplexer can also be used with a single phase power system or it can be replaced with a second A-to-D converter such that the first A-to-D converter is coupled between the filter 19 and the DSP 23 and the second A-to-D converter is coupled between the filter 20 and the DSP 23. The DSP 23 will then still convert the voltage and current signals of the power line from time-domain representations to frequency-domain representations.

In a preferred embodiment, the Attenuator 16 is a resistive attenuator with a ratio of 120:1; the current transformer 14 and its associated burden resistor 15 provide an output of 1 volt per 100 amps; the amplifier blocks 17,18 provide a gain of 3; the filter blocks 19,20 implement a 4-pole Butterworth low-pass filter with a corner frequency of 4 kiloHertz; the analog multiplexer 21 is a model AD7506 available from Analog Devices of Norwood, Mass.; the A-to-D converter 22 is a model AD574 also available from Analog Devices, sampling at 100 microsecond intervals; the DSP 23 is a model TMS320C10 available from Texas Instruments of Dallas, Tex.; the Microprocessor Subsystem 24 and the Serial Communications port 25 are based on a model 80186 microprocessor available from the Intel Corporation of Santa Clara, Calif. and supported by standard logic and timing circuits well known to persons familiar with the art; and the display 26 comprises three standard light-emitting diodes 27,28,29 operating in the visible spectrum. These values and specifications are given solely to illustrate one possible implementation of the invention which is defined fully by the appended claims and those claims in U.S. patent application Ser. No. 07/933,391 filed on Aug. 21, 1992 and U.S. patent application Ser. No. 07/934,355 filed on Aug. 21, 1992.

Figure 2:
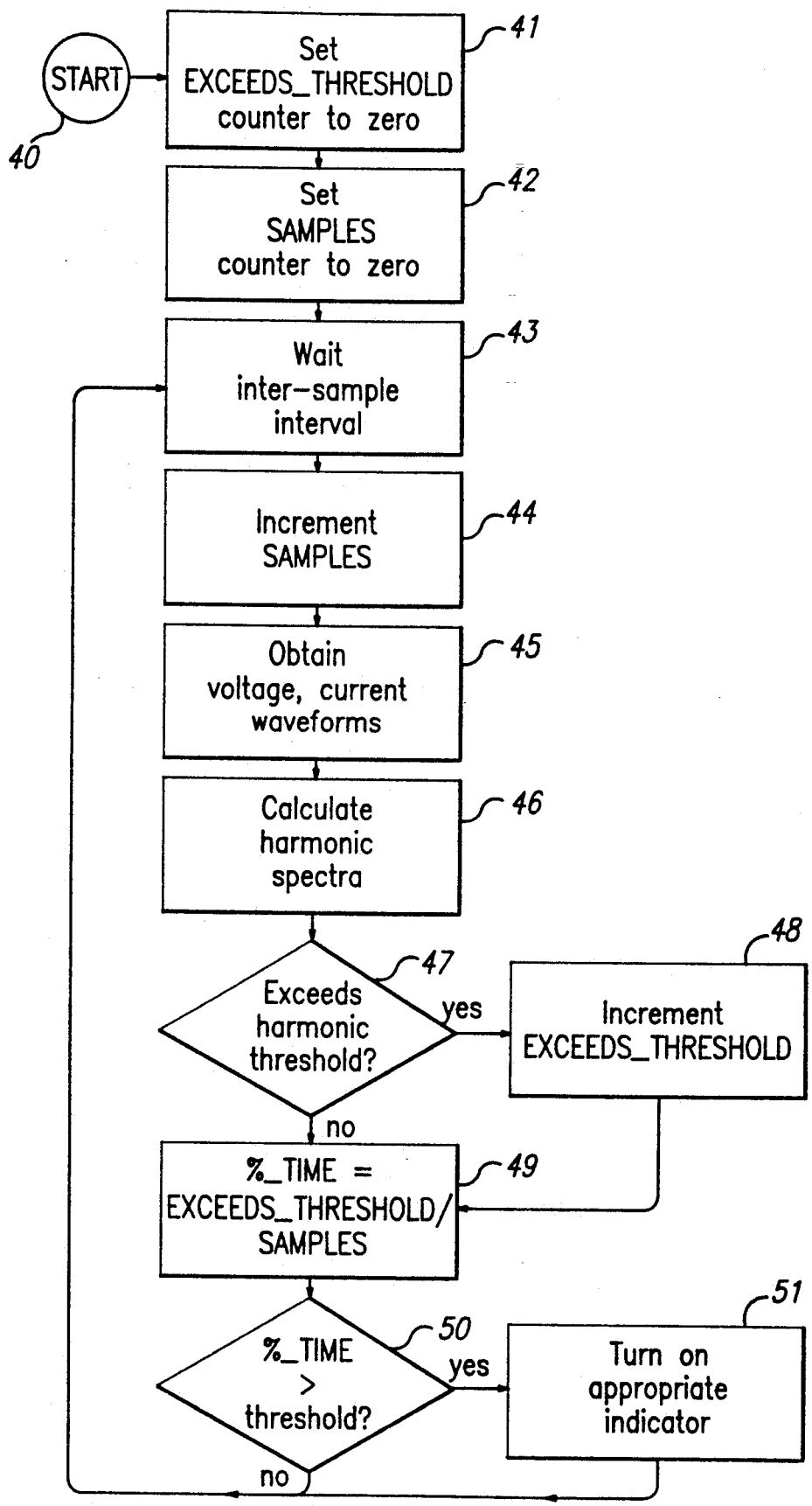
FIG. 2 shows a flow diagram of a key algorithm of the invention.

FIG. 2 illustrates an algorithm that is implemented by the Microprocessor Subsystem 24 and associated DSP 23 beginning at the Block 40. In the preferred embodiment, there are fifty-one voltage and current harmonic parameters of interest, including THD (total harmonic distortion) and each individual harmonic through the fiftieth. Each harmonic and THD is resolved by the same algorithm. It should be understood to a person of ordinary skill that these harmonic values can be resolved sequentially using the same hardware (at the expense of time) or concurrently (at the expense of circuitry) depending upon the requirements of the application being solved. For simplicity, the following description assumes that there is a single voltage harmonic parameter of interest and a single current harmonic parameter of interest. These same descriptions would apply equally well to the remaining fifty voltage and current harmonic parameters of interest, including THD.

In the algorithm, the Microprocessor Subsystem 24 takes data from the DSP concerning the voltage and current harmonics of the power system and determines if any of those harmonics exceed a threshold as programmed from the tables discussed earlier. When the algorithm begins, the Block 41 sets the EXCEEDS_THRESHOLD counter to zero and the Block 42 sets the SAMPLES counter to zero.

The Block 43 then enters a wait loop for a predetermined inter-sample interval and when that interval has elapsed the Block 44 increments the SAMPLES counter. The Blocks 45 and 46 are executed by the DSP 23. The Block 45 obtains the data concerning the voltage and current time-domain waveforms of the power system. If the system is a poly-phase system then the voltage and current waveforms of each phase in turn are presented to the A-to-D converter 22 by the multiplexer 21 and then to the DSP 23. If the system is a single phase system the voltage and current waveforms of the power system are converted using either a multiplexer and one A-to-D converter or two A-to-D converters. At Block 46, the digital time-domain waveforms are then processed by the DSP 23 in order to convert them to frequency-domain representations. The harmonics in the frequency-domain spectra are passed from the DSP 23 to the Microprocessor subsystem 24, which continues execution at the Block 47.

The Block 47 then determines if this harmonic exceeds a predetermined threshold. If the harmonic does exceed a predetermined threshold the Block 48 increments the EXCEEDS_THRESHOLD counter. The Blocks 47 and 48 will be discussed in more detail subsequently. Control is then passed to the Block 49 where a value, %_TIME, is calculated by dividing the value in the EXCEEDS_THRESHOLD counter by the value in the SAMPLES counter and the result is then stored in the %_TIME register. If the Block 47 determines that the harmonic spectra does not exceed any predetermined threshold then control is passed directly to the Block 49 bypassing the Block 48.

The Block 50 next determines if the value stored in the %_TIME register exceeds a predetermined threshold for an amount of time the predetermined harmonic threshold has been exceeded. If the predetermined threshold is exceeded by the value in the %_TIME register then the Block 51 lights up the appropriate latched indicator light 27,28,29 and control is passed back to the beginning of the loop at the Block 43. If the predetermined threshold is not exceeded by the value in the %_TIME register then the Block 51 is bypassed and control is passed back to the beginning of the loop at the Block 43.

The preferred embodiment of the invention allows the indicators to be conditioned depending upon the desire of the user. In particular, the indicators can trigger if the respective harmonic thresholds are exceeded for an instant. Similarly, the indicators can be conditioned to trigger if a time threshold for the average time or percentage of time that the harmonic thresholds are exceeded is also exceeded. In such circumstances the indicators will not trigger if the harmonic thresholds are merely exceeded momentarily. Lastly, the apparatus can be conditioned to operate with a rolling percentage trigger. This means that period for the percentage or average time that the harmonic thresholds are exceeded has a constant length but a continually new starting time. This prevents the minimizing effect of a longer time period over which the percentage or average is taken.

Figure 3:
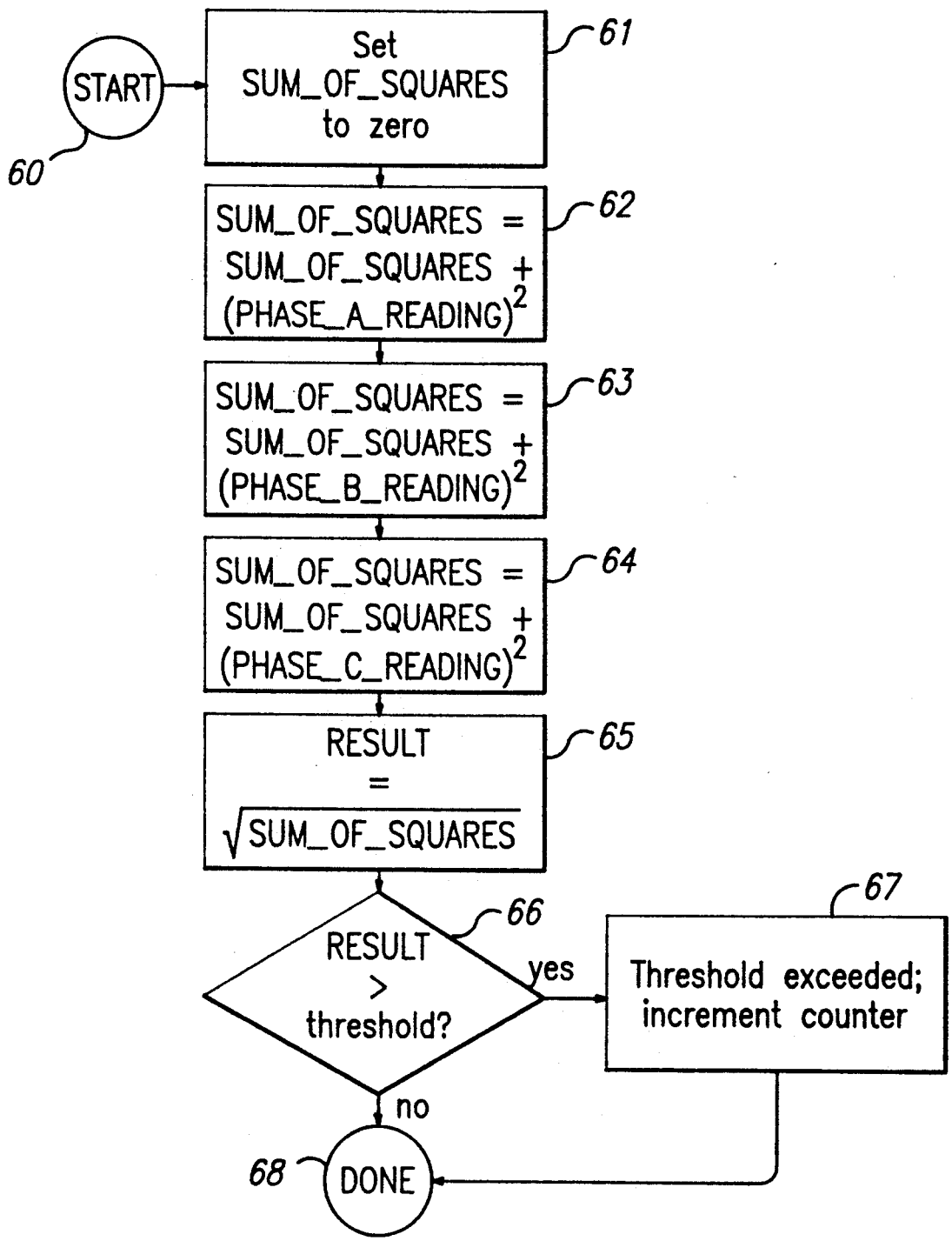
FIG. 3 shows a flow diagram that expands Blocks 47 and 48 of FIG. 2.

FIG. 3 illustrates a flow diagram that expands the Blocks 47 and 48. This subroutine begins at the Block 60. The Block 61 sets a SUM_OF_SQUARES register to zero. The Block 62 first squares the value received by the Microprocessor Subsystem 24 from the Phase A conductor 10 and then adds that value to the SUM_OF_SQUARES register and stores the result in the SUM_OF_SQUARES register. The Block 63 then squares the value received from the Phase B conductor 11 and adds that value to the SUM_OF_SQUARES register and stores the result in the SUM_OF_SQUARES register. The Block 64 then squares the value received from the Phase C conductor 12 and adds that value to the SUM_OF_SQUARES register and stores the result in the SUM_OF_SQUARES register. If only a single phase power system is being monitored, the Blocks 63 and 64 are bypassed.

The Block 65 then calculates the square root of the value stored in the SUM_OF_SQUARES register and stores the result in a RESULT register. The Block 66 then determines if the value stored in the RESULT register exceeds a predetermined threshold. If the value stored in the RESULT register does exceed the predetermined threshold, the Block 67 increments the EXCEEDS_THRESHOLD counter and control is passed to the Block 68. If the value stored in the RESULT register does not exceed the predetermined threshold, the Block 67 is bypassed and control is passed directly to the Block 68. The Block 68 then passes control back to the main algorithm and the Block 49.

Figure 4:
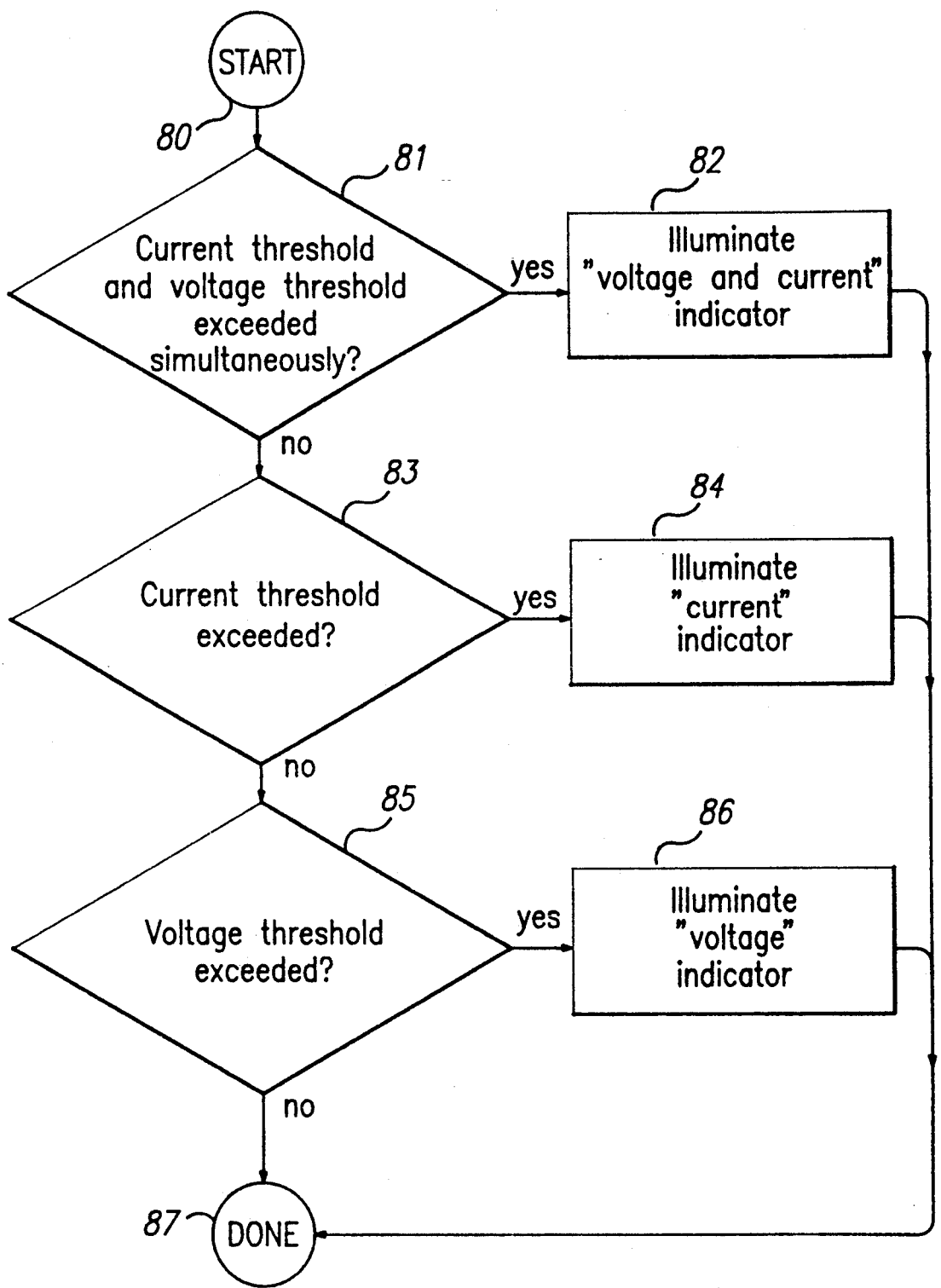
FIG. 4 shows a flow diagram that expands Blocks 50 and 51 of FIG. 2.

FIG. 4 illustrates a flow diagram that expands the Blocks 50 and 51. This subroutine begins at the Block 80. The Block 81 determines if both the predetermined current and voltage thresholds are exceeded simultaneously. If the predetermined current and voltage thresholds are exceeded simultaneously the Block 82 illuminates the "voltage and current" indicator 29 and control is passed to the Block 87. Otherwise, the Block 83 determines if the predetermined current threshold has been exceeded. If the predetermined current threshold has been exceeded the Block 84 illuminates the "current" indicator 28 and control is passed to the Block 87. Otherwise, the Block 85 determines if the predetermined voltage threshold has been exceeded. If the predetermined voltage threshold has been exceeded the Block 86 illuminates the "voltage" indicator 27. Otherwise, control is then passed to the Block 87 which then passes control back to the Block 43 of the main algorithm.

As a general rule, if the "voltage" indicator 27 lights up then the voltage harmonics are above a threshold and are the responsibility of the supplier of electricity. If the "current" indicator 28 lights up then the current harmonics are above a threshold and are the responsibility of the consumer of electricity. If the "voltage and current" indicator 29 lights up then both the voltage harmonics and the current harmonics are above their respective thresholds and should be the responsibility of the consumer of electricity because the increased harmonic currents may have caused the increased harmonic voltages.

Accordingly, the present invention provides a first indicator for signalling that the power supplied by the utility exceeds a predetermined threshold for harmonics. In this situation, the utility must resolve the deficiency. A second indicator provides notification that the power consumer has caused harmonics on the power lines which exceed the predetermined threshold. Here, the power consumer must resolve the deficiency. In addition, a third indicator is provided which signals that the harmonics exceed the threshold because both the power consumer has caused harmonics in excess of the threshold and the utility has provided power with excess harmonics. In this case, the power consumer must first correct its deficiencies because its introduction of harmonics may be the cause of the inadequate power by the utility.

For the third indicator to light, the power supplied by the utility exceeds the predetermined threshold and the power consumer has caused harmonics on the power lines simultaneously. This is because there can be no correlation between these two conditions unless the events occur at the same time. If the events happen at different times it is unlikely that the harmonics on the power lines caused by the consumer could have caused the utility to provide deficient power.

The present invention can be used by both the supplier of electricity and the consumer of electricity to prevent and control voltage and current harmonics. The supplier can assess responsibility and cost according to who is responsible for the harmonics that may occur and the consumer can prevent damage to its equipment and machinery by controlling the harmonics and gaining knowledge of when they occur. Various modifications may be made to the preferred embodiment without departing from the spirit and scope of the invention as defined by the appended claims.

We claim:

1. An apparatus for measuring voltage harmonics and current harmonics on an alternating current power system comprising:
    a. means for sensing a harmonic voltage and a harmonic current coupled to the alternating current power system;
    b. means for comparing both the harmonic voltage to a predetermined voltage threshold and the harmonic current to a predetermined current threshold, said means for comparing coupled to the means for sensing; and
    c. means for indicating when either the predetermined voltage threshold is exceeded, the predetermined current threshold is exceeded or both the predetermined voltage threshold and the predetermined current threshold are exceeded simultaneously, the means for indicating coupled to the means for comparing.

2. The apparatus as claimed in claim 1 wherein the means for sensing a harmonic voltage comprises an attenuator coupled to a power line conductor and a power neutral conductor for sensing the voltage difference between the two conductors, and wherein the means for sensing a harmonic current further comprises a current transformer and a burden resistor coupled to the power line conductor.

3. The apparatus as claimed in claim 1 wherein the power system includes a plurality of power line conductors wherein the means for sensing a harmonic voltage comprises an attenuator coupled to each of the power line conductors for sensing the voltage difference between each pair of the power line conductors, and wherein the means for sensing a harmonic current further comprises a current transformer and a burden resistor coupled to each of the power line conductors.

4. The apparatus as claimed in claim 1 further comprising a means for communicating when either the predetermined voltage threshold is exceeded, the predetermined current threshold is exceeded or both the predetermined voltage threshold and the predetermined current threshold are exceeded simultaneously, the means for communicating coupled to the means for comparing.

5. The apparatus as claimed in claim 1 wherein the means for indicating comprises:
    a. a first indicator light for indicating when the harmonic voltage exceeds the predetermined voltage threshold;
    b. a second indicator light for indicating when the harmonic current exceeds the predetermined current threshold; and
    c. a third indicator light for indicating when both the harmonic voltage exceeds the predetermined voltage threshold and the harmonic current exceeds the predetermined current threshold.

6. An apparatus for measuring voltage harmonics and current harmonics on an alternating current power system comprising:
    a. means for sensing a harmonic voltage coupled to the alternating current power system;
    b. means for sensing a harmonic current coupled to the alternating current power system;
    c. means for comparing the harmonic voltage to a predetermined voltage threshold, said means for comparing coupled to the means for sensing a harmonic voltage;
    d. first means for indicating when the harmonic voltage exceeds the predetermined voltage threshold, the first means for indicating coupled to the means for comparing the harmonic voltage;
    e. means for comparing the harmonic current to a predetermined current threshold, said means for comparing coupled to the means for sensing a harmonic current;
    f. second means for indicating when the harmonic current exceeds the predetermined current threshold, the second means for indicating coupled to the means for comparing the harmonic current; and g. third means for indicating when both the harmonic voltage exceeds the predetermined voltage threshold and the harmonic current exceeds the predetermined current threshold, the third means for indicating coupled to the means for comparing the harmonic voltage and the means for comparing the harmonic current.

7. The apparatus as claimed in claim 6 wherein the means for sensing a harmonic voltage comprises an attenuator coupled to a power line conductor and to a power neutral conductor for sensing the voltage difference between the two conductors.

8. The apparatus as claimed in claim 6 wherein the power system includes a plurality of power line conductors wherein the means for sensing a harmonic voltage comprises an attenuator coupled to each of the power line conductors for sensing the voltage difference between each pair of the power line conductors, and wherein the means for sensing a harmonic current further comprises a current transformer and a burden resistor coupled to each of the power line conductors.

9. The apparatus as claimed in claim 7 wherein the means for sensing a harmonic current comprises a current transformer and a burden resistor coupled to the power line conductor.

10. The apparatus as claimed in claim 8 wherein the means for sensing a harmonic current comprises a current transformer and a burden resistor coupled to the power line conductor.

11. The apparatus as claimed in claim 6 further comprising a first means for communicating when the harmonic voltage exceeds the predetermined voltage threshold, the first means for communicating coupled to the means for comparing the harmonic voltage.

12. The apparatus as claimed in claim 11 further comprising a second means for communicating when the harmonic current exceeds the predetermined current threshold, the second means for communicating coupled to the means for comparing the harmonic current.

13. The apparatus as claimed in claim 12 further comprising a third means for communicating when both the harmonic voltage exceeds the predetermined voltage threshold and the harmonic current exceeds the predetermined current threshold, the third means for communicating coupled to the means for comparing the harmonic voltage and the means for comparing the harmonic current.

14. An apparatus for measuring voltage and current harmonics on an alternating current power system having a power line conductor and a power neutral conductor, comprising:
   a. a current transformer coupled to the power line conductor;
   b. a burden resistor coupled to the current transformer for producing a first voltage signal which represents a current flowing in the power line conductor;
   c. a first amplifier coupled to the burden resistor for adjusting the first voltage signal;
   d. a first filter coupled to the first amplifier for removing undesired frequencies from the first voltage signal;
   e. an attenuator coupled to the power line conductor and the power neutral conductor for receiving a second voltage signal which represents a voltage difference between the power line conductor and the power neutral conductor;
   f. a second amplifier coupled to the attenuator for adjusting the second voltage signal;
   g. a second filter coupled to the second amplifier for removing undesired frequencies from the second voltage signal;
   h. a first analog-to-digital converter coupled to the first filter for converting the analog first voltage signal to a first digital time-domain signal;
   i. a second analog-to-digital converter coupled to the second filter for converting the analog second voltage signal to a second digital time-domain signal;
   j. means for processing digital signals coupled to the first and the second analog-to-digital converters for converting the first time-domain signal to a first frequency-domain representation having a plurality of current harmonics representing the current in the power line and for converting the second time-domain signal to a second frequency-domain representation having a plurality of voltage harmonics representing the voltage difference between the power line conductor and the power neutral conductor;
   k. a control subsystem coupled to the means for processing digital signals for determining if any of the current harmonics received from the means for processing digital signals circuit exceeds a predetermined current threshold and if any of the voltage harmonics received from the digital signal processing circuit exceeds a predetermined voltage threshold; and
   l. a display coupled to the control subsystem for indicating if any of the frequency-domain representations do exceed a predetermined threshold.

15. The apparatus according to claim 14 wherein the control subsystem is a microprocessor.

16. The apparatus according to claim 15 wherein the means for processing digital signals is performed by the microprocessor.

17. The apparatus according to claim 15 wherein the means for processing digital signals is performed by a digital signal processor.

18. The apparatus as claimed in claim 14 wherein an analog multiplexer coupled to the first and the second filters and a single analog-to-digital converter coupled to the analog multiplexer and the digital signal processing circuit can be substituted for the first and the second analog to digital converters.

19. The apparatus as claimed in claim 14 wherein the display comprises:
   a. a first indicator light for indicating when any of the voltage harmonics exceed the predetermined voltage threshold;
   b. a second indicator light for indicating when any of the current harmonics exceed the predetermined current threshold; and
   c. a third indicator light for indicating when any of the voltage harmonics exceed the predetermined voltage threshold and any of the current harmonics exceed the predetermined current threshold simultaneously.

20. The apparatus as claimed in claim 19 further comprising a serial communications port coupled to the microprocessor subsystem for communicating when any of the predetermined thresholds have been exceeded.

* * * * *

UNITED STATES PATENT AND TRADEMARK OFFICE
CERTIFICATE OF CORRECTION

PATENT NO. : 5,298,888
DATED : 03/29/94
INVENTOR(S) : McEachern et al.

It is certified that error appears in the above-identified patent and that said Letters Patent is hereby corrected as shown below:

In column 6, lines 33 - 34, please replace "O-F" with --OF--.

In column 6, lines 38 - 39, please replace "S-QUARES" with --SQUARES--.

In column 10, line 28, please replace "exceeds" with --exceed--.

In column 10, line 31, please replace "exceeds" with --exceed--.

Signed and Sealed this

Twenty-sixth Day of July, 1994

*Attest:*

BRUCE LEHMAN

*Attesting Officer*     *Commissioner of Patents and Trademarks*